(12) United States Patent
Sato

(10) Patent No.: US 6,960,535 B1
(45) Date of Patent: Nov. 1, 2005

(54) DUAL DAMASCENE ETCHING PROCESS

(75) Inventor: Masayuki Sato, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/845,160

(22) Filed: May 14, 2004

(51) Int. Cl.[7] .................... H01L 21/302; H01L 21/461
(52) U.S. Cl. .................. 438/738; 438/724; 438/744; 438/709; 438/710; 438/711; 438/714; 438/723
(58) Field of Search ................. 438/738, 724, 438/744, 709, 711, 710, 714, 700, 723, 706

(56) References Cited

U.S. PATENT DOCUMENTS

| | | | |
|---|---|---|---|
| 6,362,109 B1 * | 3/2002 | Kim et al. .................. 438/706 |
| 6,372,636 B1 * | 4/2002 | Chooi et al. ................ 438/639 |
| 6,448,177 B1 * | 9/2002 | Morrow et al. ............. 438/638 |
| 6,479,391 B2 * | 11/2002 | Morrow et al. ............. 438/706 |
| 6,607,986 B2 * | 8/2003 | Seta et al. .................. 438/710 |
| 6,787,474 B2 * | 9/2004 | Komada ...................... 438/706 |
| 6,790,772 B2 * | 9/2004 | Chung et al. ............... 438/638 |
| 2002/0182880 A1 * | 12/2002 | Zhu et al. ................... 438/724 |
| 2003/0164354 A1 * | 9/2003 | Hsieh et al. ................. 216/22 |

OTHER PUBLICATIONS

D. Edelstein et al., "Full Copper Wiring in a Sub-0.25 um CMOS ULSI Technology", Proc. IEEE IEDM, 1997.
S. Venkatesan et al.; "A High Performance 1.8V, 0.20 um CMOS Technology with Copper Metallization", Proc. IEEE IEDM, 1997.

* cited by examiner

*Primary Examiner*—David Zarneke
*Assistant Examiner*—Igwe U. Anya
(74) *Attorney, Agent, or Firm*—Birch, Stewart, Kolasch & Birch, LLP

(57) ABSTRACT

An etching process yields an optimized formation of via holes through the combination of semiconductor material selection and etchant parameters. Over an interlayer dielectric layer is formed a stop layer having a SiON layer over which is a SiC layer. Selective etching will attack the SiC layer while leaving the SiON layer undisturbed. When etching the via hole, a proportion of about 7:90 $O_2$:CO was observed to yield a superior etch.

8 Claims, 13 Drawing Sheets

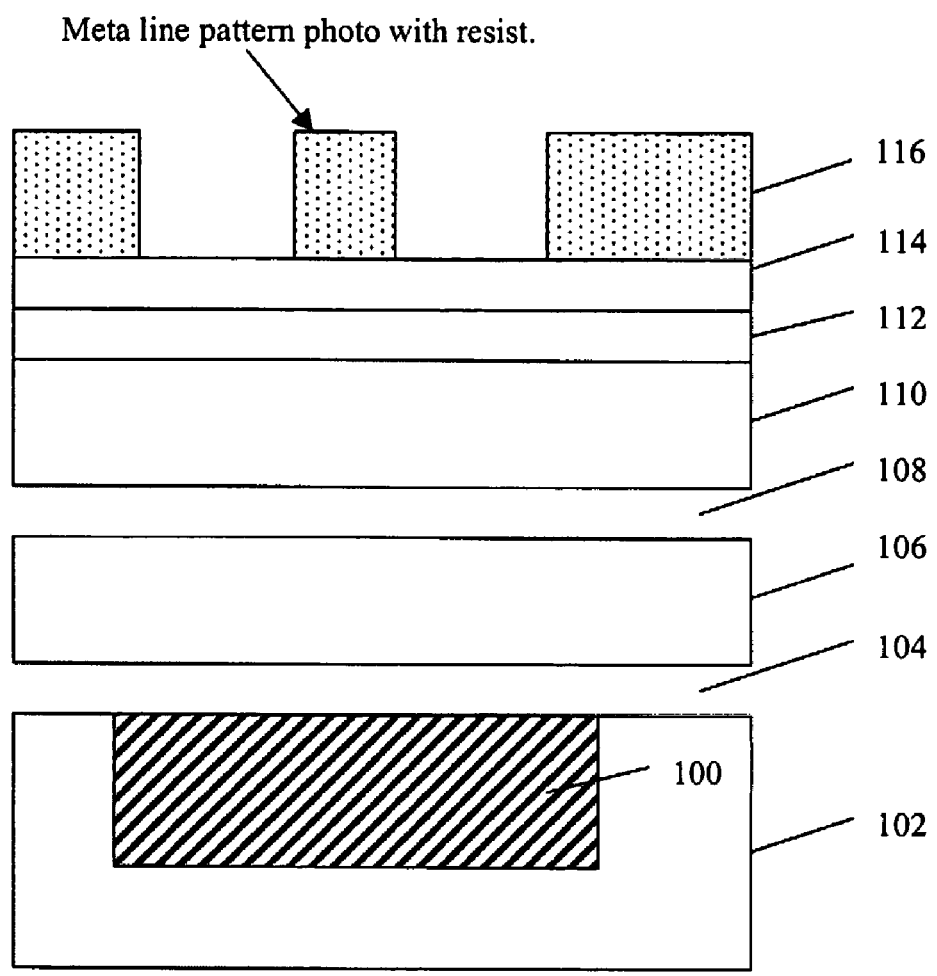

Metal line pattern SiON(114) etch .

Hole pattern photo on the dual BARC ( 114:SiON and 112:SiC) with resist.

Hole pattern Organic BARC and SiC(112) etch.

Hole pattern dielectric layer (110) etch.

Sequential resist ashing step.

SiC etch.

Dielectric layer (110 and 106) etch.

SiC layer (108 and 104) etch

DUAL DAMASCENE ETCHING PROCESS

FIELD OF THE INVENTION

An improved etching process creates a via hole using a 1-step dual damascene method.

BACKGROUND OF THE INVENTION

Damascene refers to a process in which interconnect metal lines are delineated by isolating dielectrics. Damascening is not performed by lithography and etching, but by chemical-mechanical planarization (CMP). In damascening, an interconnect pattern is first lithographically defined in the layer of dielectric, and then metal is deposited to fill in the resulting trenches. Then excess metal is removed by means of chemical-mechanical polishing (planarization).

Chemical-mechanical polishing (CMP), also called chemical-mechanical planarization, refers to a method of removing layers of solid by chemical-mechanical polishing carried out for the purpose of surface planarization and definition of the metal interconnect pattern.

Dual damascene is a modified version of the damascene process that is used to form metal interconnect geometry using a CMP process instead of metal etching. In dual damascene, two interlayer dielectric patterning steps and one CMP step create a pattern that would otherwise require two patterning steps and two metal CMP steps when using a conventional damascene process.

FIG. 1(a) through FIG. 1(d) are drawings explaining a conventional method of manufacturing a semiconductor device having dual damascene structure wiring.

In a first conventional method of manufacturing a semiconductor shown in FIG. 1(a), a first silicon nitride ($Si_3N_4$) film 3, a first silicon oxide film 4, a second silicon nitride ($Si_3N_4$) film 5 and a second silicon oxide film 6 are successively formed over a layer insulation film 2 in which a first wiring layer 1 is embedded. The first wiring layers are formed on a substrate, not depicted in the drawings for the sake of brevity.

Next, as is shown in FIG. 1(b), anisotropic dry etching to open via hole 8 is performed using a first photoresist 7 as a mask. This etching is performed until the first nitride film 3 is exposed in the interior of via hole 8. The via hole 8 is also referred to as a contact hole. The first nitride film 3 acts as a stopper film that stops the progress of etching in this etching process as shown in FIG. 1(b).

When the etching to open via hole 8 is finished, the first photoresist 7 is removed from above the second silicon oxide film 6. Optionally, a second photoresist 9 that has an open portion that corresponds to the wiring slot 10 is formed in its place, as shown in FIG. 1(c).

Next, anisotropic dry etching to open wiring slot 10 is performed using the second photoresist 9 as a mask. This etching is performed under the condition that a silicon oxide film can be removed with a significant selection ratio to the silicon nitride film. At this time, the first silicon nitride film 3 and the second nitride film 5 are both used as stopper films that stop the progress of etching. Next, etching for the purpose of removing the second silicon nitride film 5 exposed in the bottom of wiring slot 10 and the first silicon nitride film 3 exposed in the bottom of via hole 8 is performed. If this processing is done properly, via hole 8 which exposes the surface of first wiring layer 1 and wiring slot 10 which leads to via hole 8 are formed as shown in FIG. 1(d).

A typical damascene structure according to the conventional art is described by D. Edeletein et al., Proc. IEEE IEDM (1997) and S. Venkatesan et al., Proc. IEEE IEDM (1997).

Via hole formation according to the conventional art gives rise to a number of problems as feature size decreases. For example, etch selectivity must be controlled during the etch to prevent photoresist from being prematurely removed to cause damage to the underlying layers. For example, if a plasma etch uses a gas mixture that contains a 1:1 proportion of oxygen to carbon monoxide, then both the photoresist and the material not covered by the photoresist would be etched at the same rate. In order to prevent damage to the semiconductor device, it would then be necessary to use a very thick layer of photoresist, which could then cause poor line, trench and via hole definition.

Additional difficulties in conventional etch processes arise when silicon is etched using a fluorocarbon gas such as $CF_4$. The etch process converts the silicon to $SiF_4$, but a polymeric carbon residue remains on the semiconductor, frequently appearing as a "fence" around the via hole.

As has been shown, the conventional art technologies have disadvantages arising from inefficient etching. These disadvantages give rise to manufacturing inefficiency, semiconductor damage and such phenomena as the creation of fences from residual materials around the via holes. These fences give rise to such unwanted effects such as parasitic capacitance and reduced conductance by the metal component. Accordingly there is a need to provide new etch technologies that minimize these disadvantageous phenomena.

SUMMARY OF THE INVENTION

The invention, in part, pertains to a method for forming a via hole on a dual damascene structure that overcomes the disadvantages of the conventional art.

The invention, in part, pertains to a process for manufacturing a semiconductor device that includes forming a first stopper layer over an insulation layer in which a wiring layer is embedded, forming a first interlayer dielectric over the first stopper layer, forming a second stopper film over the first interlayer dielectric, forming a second interlayer dielectric over the second stopper film, forming a third stopper film over the second dielectric, and etching a via hole in the semiconductor device, wherein the etching comprises at least one etch using an etchant gas that has a proportion of oxygen to carbon monoxide of about 7:90. In preferred embodiments of the invention, the first stopper layer comprises SiN, the second stopper layer comprises SiC, and the third stopper layer comprises a layer of SiON over the second dielectric and a layer of SiC over the layer of SiON. The wiring layer preferably comprises copper.

The invention, in in a preferred embodiment pertains to a series of sequential etch steps that includes (1) etching using a gas mixture comprising Ar:$C_4F_8$:$C_2F_6$:$O_2$ in a proportion of about 200:19:30:30, (2) etching using a gas mixture comprising Ar:$O_2$:$C_4F_8$:CO in a proportion of about 60:7:12:90, (3) etching using a gas mixture comprising Ar:$CHF_3$:$C_2F_6$:$N_2$ in a proportion of about 125:10:40:20, (4) etching using a gas mixture comprising Ar:$O_2$:$C_4F_8$:CO in a proportion of about 60:4:12:90, and (5) etching using a gas mixture comprising Ar:$N_2$:$C_4F_8$:CO in a proportion of about 60:8:12:100. In a preferred embodiment of the invention, in part, the method further comprises ashing using not more than 8% oxygen. Step (2) has a high selectivity to SiC. Step (5) does not require a high selectivity to SiC as it is a SiC etch step. The use of oxygen in the etch gas of step (5) is avoided to suppress CuO formation. Accordingly, the etch gas of step (5) should contain zero mol percent oxygen to minimize CuO formation.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention. The drawings illustrate embodiments of the invention and together with the description serve to explain the principles of the embodiments of the invention.

FIG. 2 shows a method from manufacturing a semiconductor device according to a preferred embodiment of the invention.

DETAILED DESCRIPTION

Figure 1A:
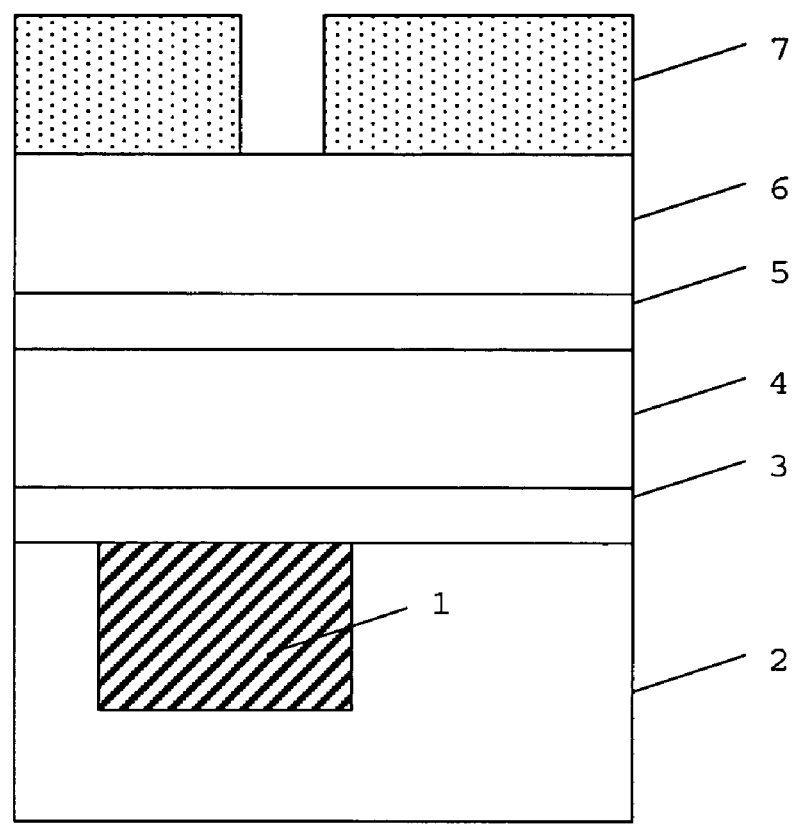
FIG. 1(a) shows a method of manufacturing a semiconductor device according to the conventional art.
Figure 1B:
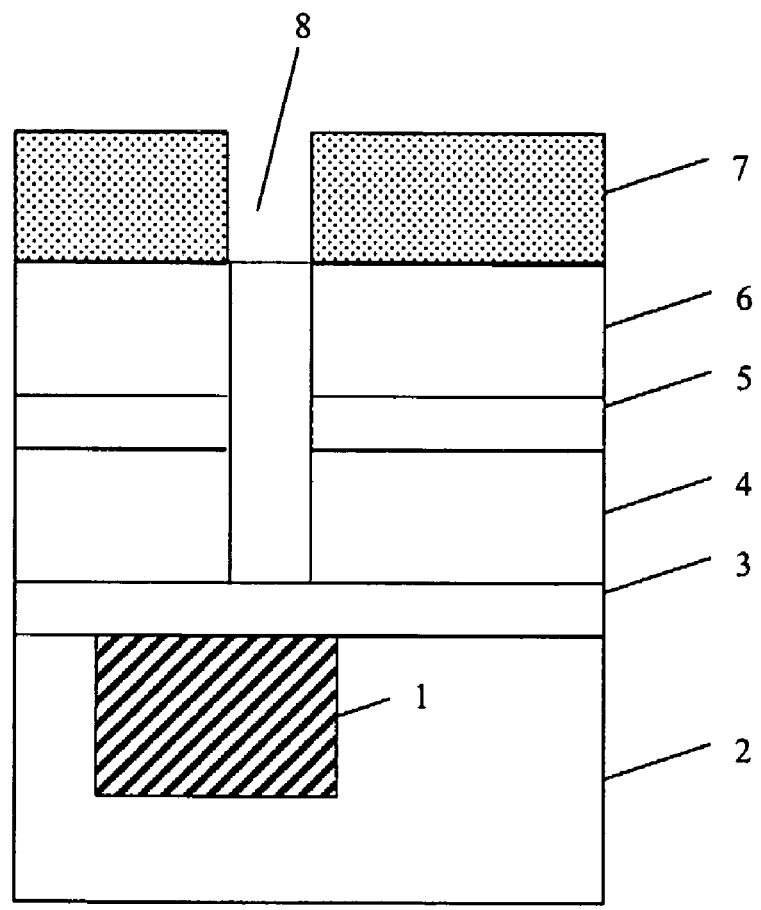
FIG. 1(b) shows the step of forming a via hole in a semiconductor device according to the conventional art.
Figure 1C:
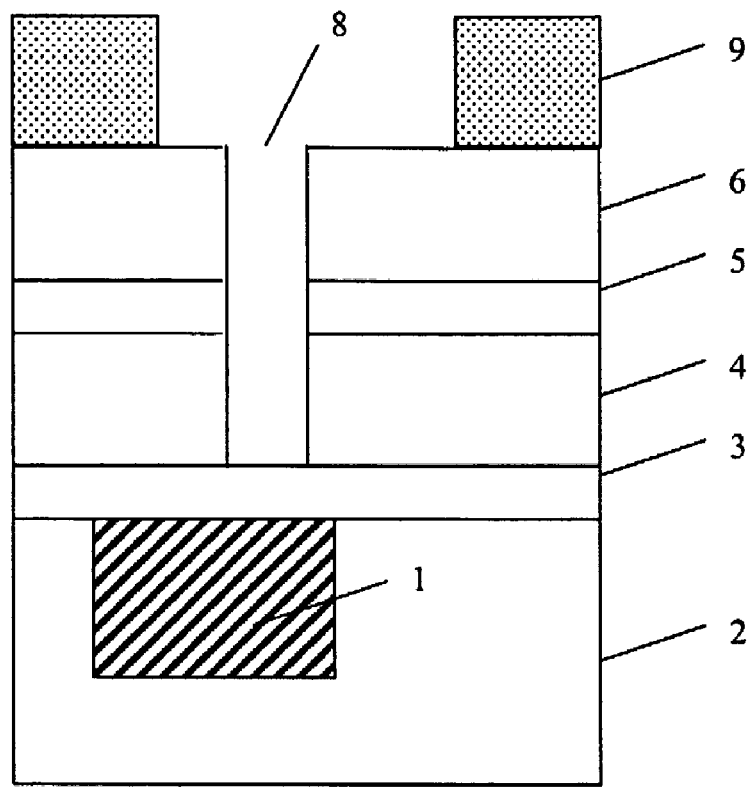
FIG. 1(c) shows the step of forming a wiring slot structure in a semiconductor device according to the conventional art.
Figure 1D:
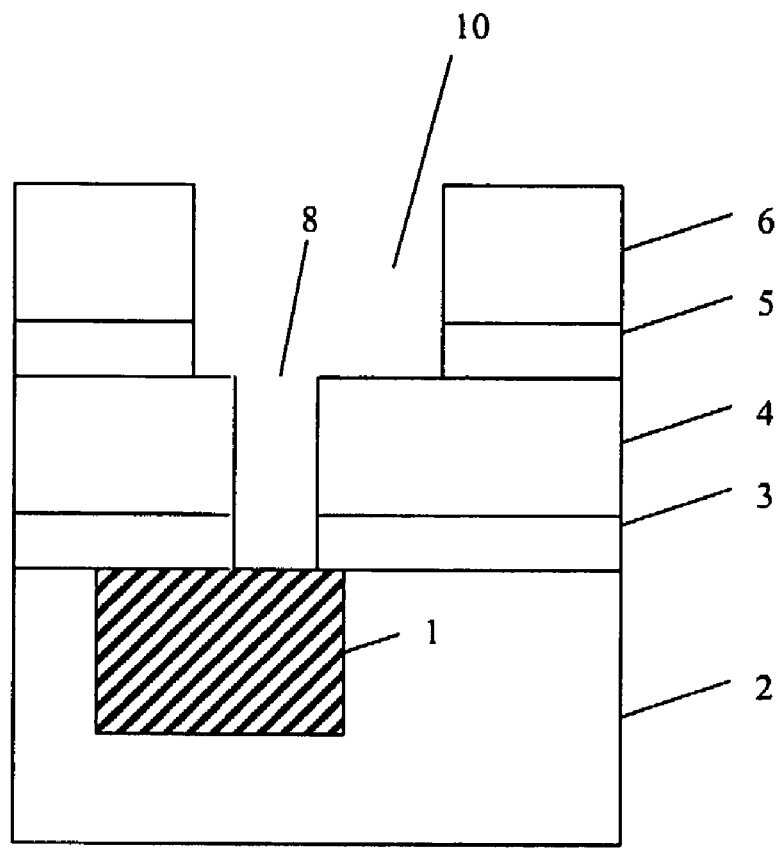
FIG. 1(d) shows the step of etching the wiring slot in a semiconductor device according to the conventional art.

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

FIG. 2 shows a method from manufacturing a semiconductor device according to a preferred embodiment of the invention. A first stopper film 104, a first interlayer dielectric (ILD) 106, a second stopper film 108 and a second interlayer dielectric 110 are successively formed over a layer insulation film 102 in which a wiring layer 100 is embedded. The wiring layer 100 can comprise copper, aluminum or an aluminum-copper alloy, but is preferably copper. The first wiring layers are formed on a substrate, not depicted in the drawings for the sake of brevity. The stopper films, 104, 108 can comprise silicon nitride ($Si_3N_4$) or silicon carbide (SiC), but they are not restricted to these materials. In a preferred embodiment of the invention, the first stopper film 104 comprises silicon nitride and the second stopper film 108 comprises silicon carbide.

In FIG. 2, the ILDs, 106, 110 can be formed from any suitable material, including silicon dioxide, BSG (borosilicate glass), BPSG (borophosphosilicate glass) and FSG (fluorosilicate glass). Preferably, the ILDs, 106, 110 are formed from FSG.

In FIG. 2, over the second ILD 110 is formed a layer of SiON 112, over which is formed a layer of SiC 114. The layer of SiC 114 is a BARC and etch stopper. The layer of SiON 112 is a BARC layer. Over the SiC layer 114 is formed a layer of photoresist 116 that has been patterned with spaces over the portions corresponding to wiring trenches.

The thicknesses of the layers shown in the embodiment of the invention shown in FIG. 2 are not restricted. Preferred thicknesses of the layers are about 70 nm for the SiC film 114, about 120 nm for the SiON film 112, about 400 nm for the second ILD layer 110, about 50 nm for the second stopper film 108, about 350–400 nm for the first ILD 106 and about 50 nm for the first stopper film 104.

Figure 3:
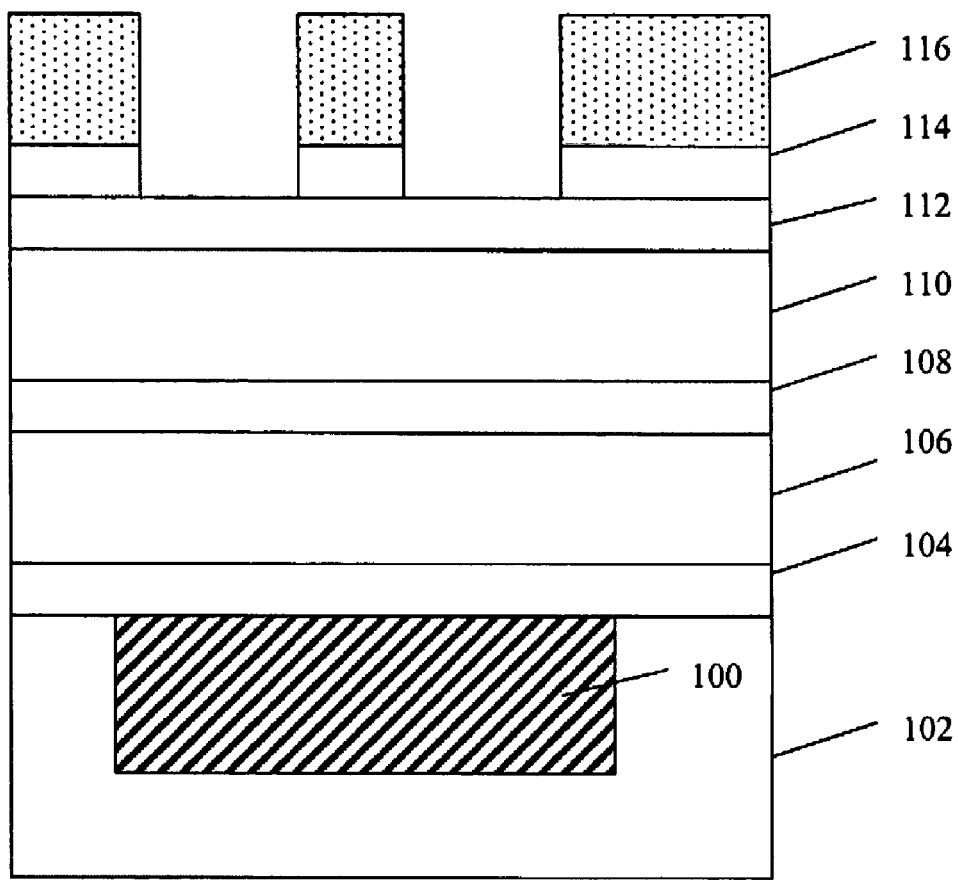
FIG. 3 shows trench formation according to a preferred embodiment of the invention.

FIG. 3 shows trench formation according to a preferred embodiment of the invention. The trench is formed using a dry etch such as plasma etch. The preferred etch uses a mixture of gases containing either $CF_4$ or $CHF_3$ as the fluorine source. The preferred etch conditions include $CHF_3/CF_4/O_2$=1.2:15:1, 1800 W, 40 mTorr. The fluorine radical in the gas reacts with the carbon in the SiC layer 114 to generate a carbon-containing gas. However, when the etch reaches the underlying SiON BARC layer 112, the etch stops because there is no reactive carbon in the SiON BARC layer 112 to react with the fluorine radical. After the etch, the photoresist layer 116 is removed. The photoresist layer can be removed by any conventional method such as ashing.

Figure 4:
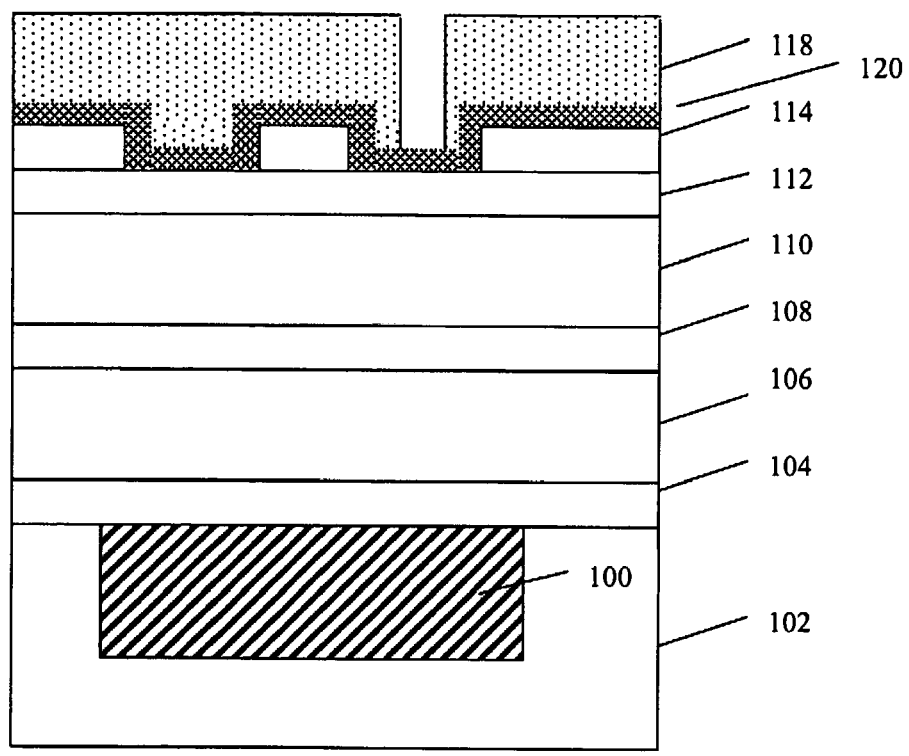
FIG. 4 shows the patterning of via holes according to a preferred embodiment of the invention.
Figure 5:
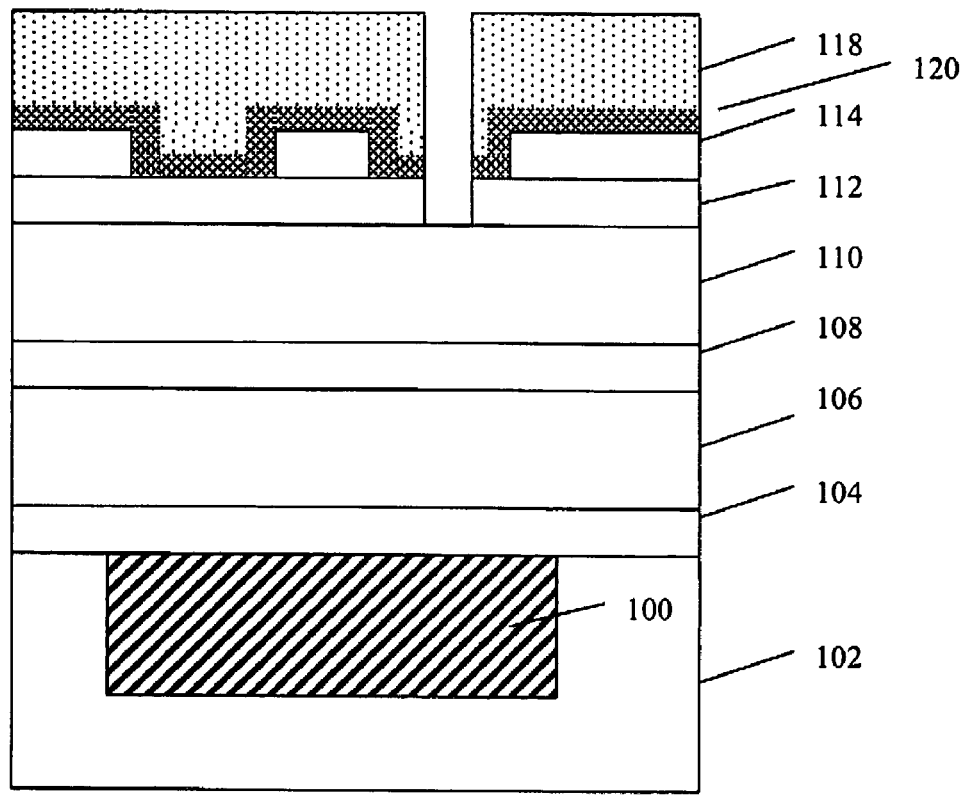
FIG. 5 shows the via hole BARC etch sequence according to a preferred embodiment of the invention.
Figure 6:
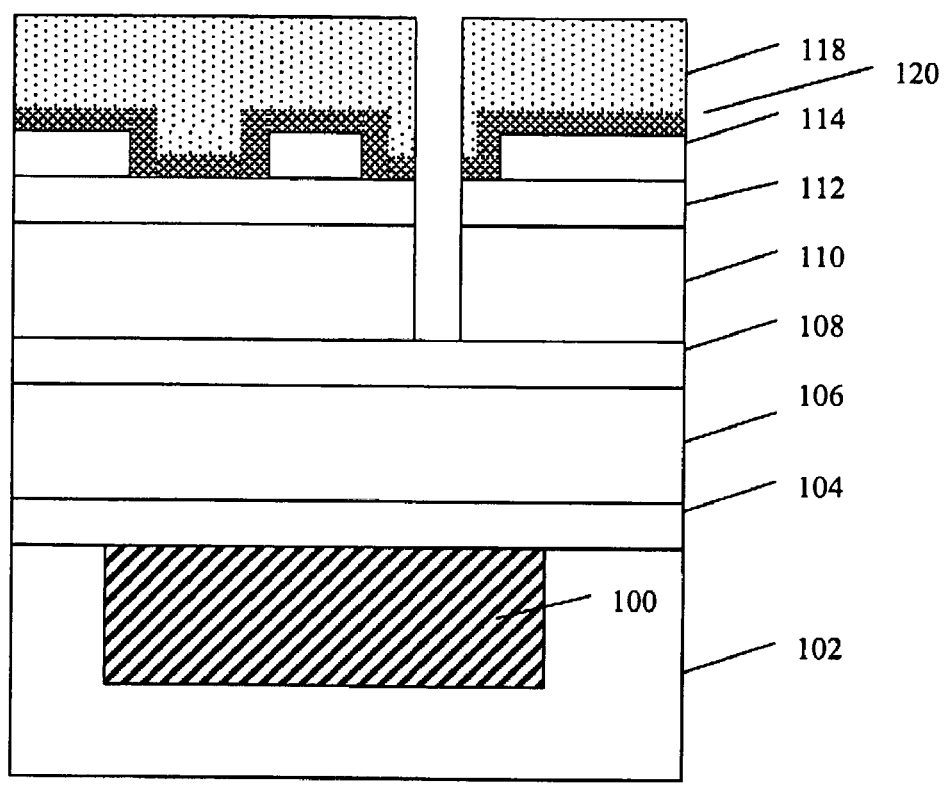
FIG. 6 shows the via hole upper ILD (110) etch sequence according to a preferred embodiment of the invention.
Figure 7:
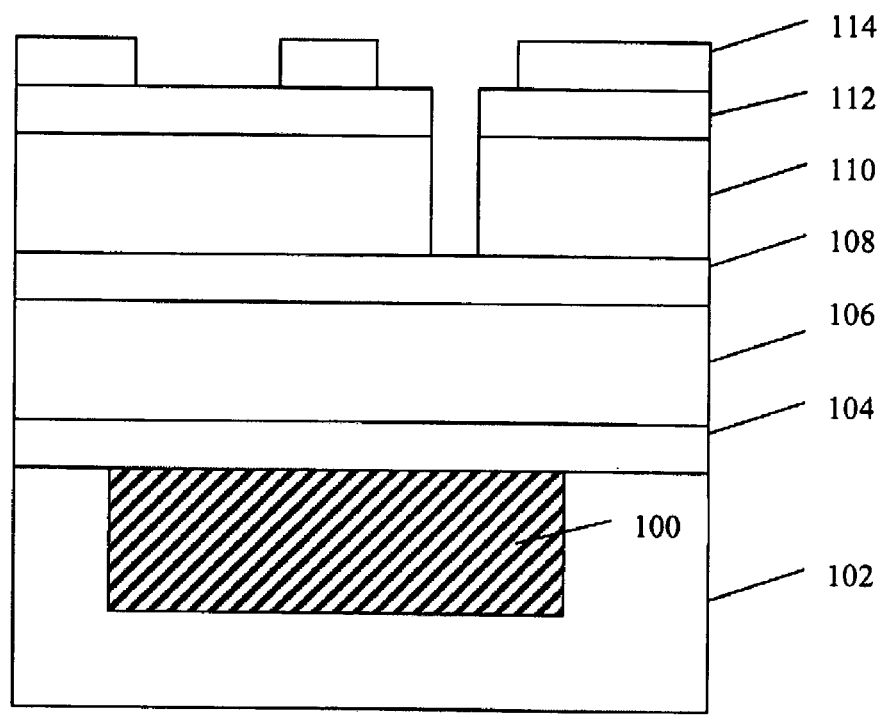
FIG. 7 shows sequential photoresist ashing.
Figure 8:
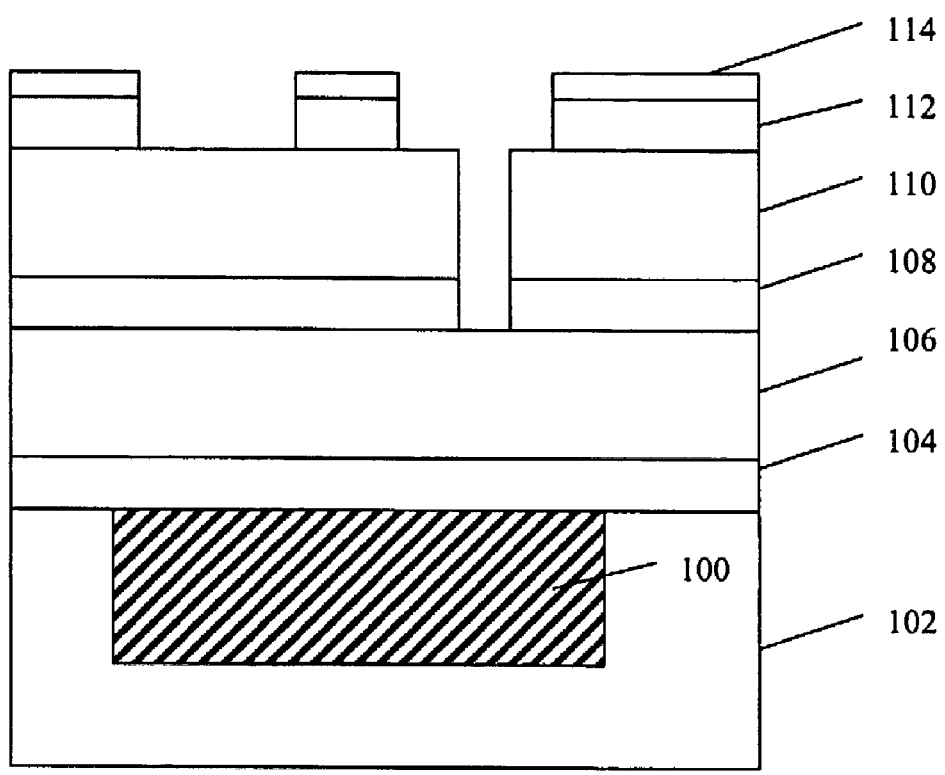
FIG. 8 shows the stopper layer (112 and 108) etch sequence according to a preferred embodiment of the invention.
Figure 9:
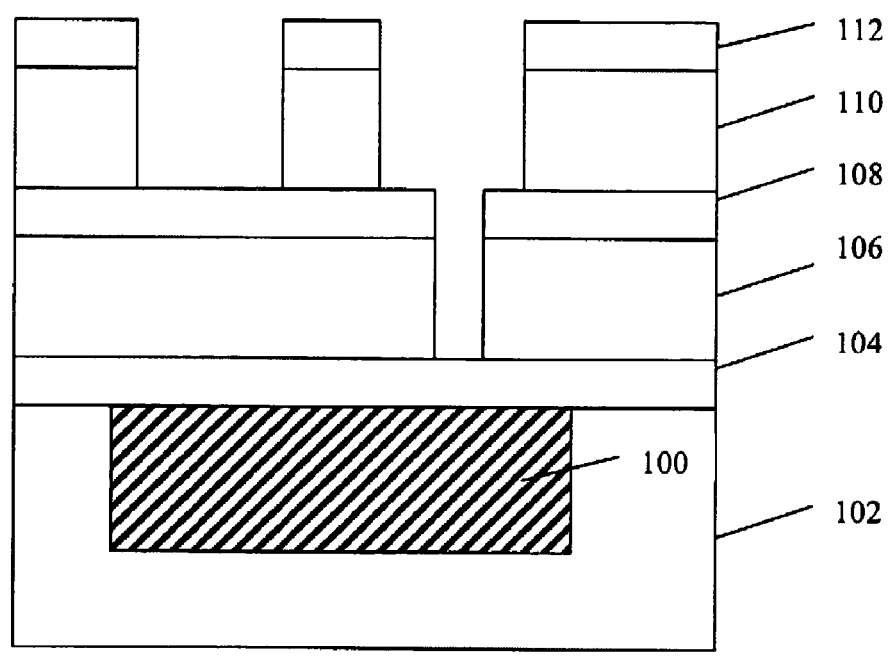
FIG. 9 shows the via hole lower ILD (106) etch and trench upper ILD (106) etch sequence according to a preferred embodiment of the invention.
Figure 10:
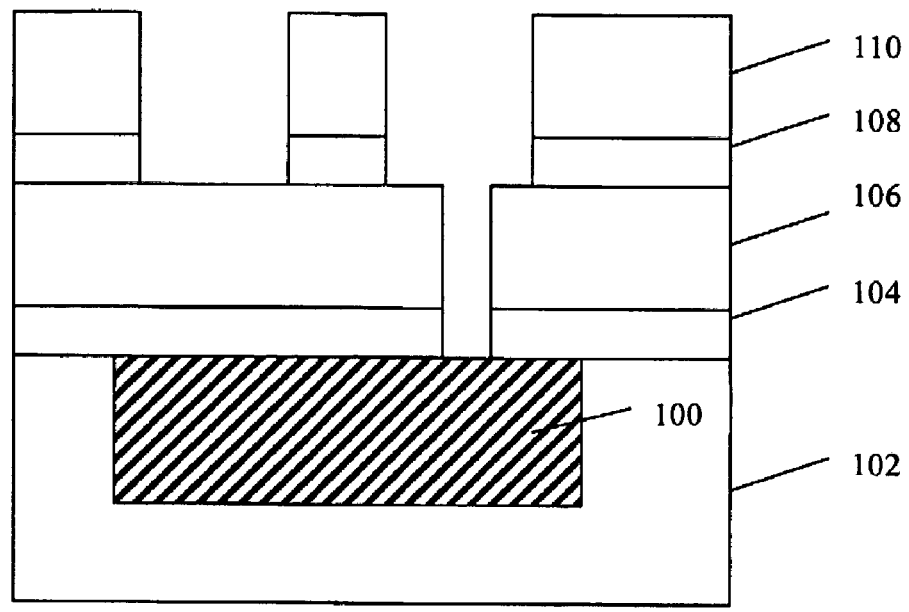
FIG. 10 shows the etch stopper layer (112,108 and 104) etch sequence according to a preferred embodiment of the invention.

FIG. 4 shows the patterning of via holes according to a preferred embodiment of the invention. Following the removal of the photoresist layer 116, a second photoresist layer 118 and organic BARC layer 120 are formed that has the pattern of the desired via holes. The photoresist layer 118 and organic BARC layer 120 cover the sides of the SiC layer 114 that forms the sides of the trench.

FIGS. 5, 6, 7, 8, 9 and 10 show the via hole etch and trench etch sequence according to a preferred embodiment of the invention. A first etch etches through the SiON BARC layer 112, the SiC film 114 and a portion of the dielectric layer 110. A second etch step removes an upper portion of the dielectric layer 110 (See FIG. 6). An ashing step to remove the photo resist and organic BARC can be performed between the 110 layer etch step and the 108 layer etch step (See FIG. 7). Then, an etch is performed of the remainder of layer 108 and layer 112 (See FIG. 8). Afterwards, portions of the dielectric layers 110 and 106 are removed (See FIG. 9). Finally, remaining portions of the SiC layer 112 and the SiN layer 104 are removed (See FIG. 10). Removal of the portion of the SiN layer 104 exposes a portion of the metal layer 100. The conditions and etch gases for each of the etch steps shown in FIGS. 5 to 10 are not restricted as long as the each etch step etches only the desired portion of the semiconductor stack in the via hole. Also, as discussed above, the presence of oxygen gas in the etch gas of step (5) is preferably completely avoided. Typical preferred etch conditions are given in Example 1.

EXAMPLE 1

Over a wafer substrate was formed a 100 nm layer of Organic BARC, over which was consecutively formed a 50 nm layer of SiC, a 120 nm layer of SiON, a layer of FSG, a layer of SiN, a layer of FSG and a layer of SiN. The FSG layers have thicknesses of about 500 nm, and the SiN layers have thicknesses of about 50 nm. After forming the trench, a via hole was etched using the etch sequence set forth in Table 1.

TABLE 1

Via hole and trench etch steps

| Step No. | Etch | Gas | Etch Gas Ratio | Power (W) | Pressure (mTorr) | Mag. Field (G) |
|---|---|---|---|---|---|---|
| 1 | BARC and SiC | $Ar:C_4F_8:C_2F_6:O_2$ | 11:1:2:2 | 1000 | 90 | 20 |
| 2 | Dielectric | $Ar:O_2:C_4F_8:CO$ | 9:1:2:13 | 1600 | 55 | 20 |
| 3 | SiC | $Ar:CHF_3:C_2F_6:N_2$ | 13:1:4:2 | 900 | 120 | 0 |
| 4 | Dielectric | $Ar:O_2:C_4F_8:CO$ | 15:1:3:23 | 1600 | 55 | 20 |
| 5 | SiC | $Ar:N_2:C_4F_8:CO$ | 8:1:2:13 | 1600 | 55 | 20 |

Note: Steps (1)–(5) correspond to FIGS. 5, 6, 8, 9 and 10, respectively.

Note: Steps (1)–(5) correspond to FIGS. 5, 6, 8, 9 and 10, respectively.

In order to maintain a constant depth of all the via holes, an end point detector system was used. Optical emission spectroscopy is the most common method for etch endpoint detection because it is easy to implement with high sensitivity.

When etching the via hole, the etch selectivity must be controlled to prevent the photoresist from being prematurely removed. If, for example, in the second etch step (corresponding to No. 2 in Table 1, the ratio of $O_2$:CO is 1:1, then the photoresist and the material underlying the via hole portion would both etch at the same rate, which is disadvantageous because there is no selectivity. However, an optimal selectivity was unexpectedly found at a $O_2$:CO ratio of about 7:90 (about 1:13) for the second etch step No. 2 in Table 1.

After the second etch step, there is an ashing step in the sequence. This ashing step removes excess polymer that forms during the etching, as is explained in comparing equation 1 for $SiO_2$ and equation 2 for Si.

$$SiO_2 + CF_4 \rightarrow SiF_4 + CO + O \quad (1)$$

$$Si + CF_4 \rightarrow SiF_4 + C(polymeric) \quad (2)$$

In an ashing process according to the conventional art, a high concentration of oxygen is used to ash the photoresist, but the k value (dielectric constant) of the FSG increases. This is not preferable because the capacitance of the embedded lines changes the speed of the transistor. That is, the speed of the transistor decreases as the dielectric constant increases. In the conventional art, the ashing was typically performed using 100 percent oxygen. However, in a preferred embodiment of the invention, the oxygen is diluted with argon to about 8% oxygen or less. Helium and neon can also be used instead of argon as the diluent gas.

The foregoing embodiments and advantages are merely exemplary and are not to be construed as limiting the present invention. The present teaching can be readily applied to other types of methods and apparatuses. The description of the present invention is intended to be illustrative, and not to limit the scope of the claims. Many alternatives, modifications, and variations will be apparent to those skilled in the art. It is to be understood that the foregoing descriptions and specific embodiments shown herein are merely illustrative of the best mode of the invention and the principles thereof, which is therefore understood to be limited only by the scope of the appended claims.

What is claimed is:

1. A process for manufacturing a semiconductor device, which comprises:
   providing an insulation layer in which a wiring layer is embedded;
   forming a first stopper layer over the insulation layer;
   forming a first interlayer dielectric over the first stopper layer;
   forming a second stopper layer over the first interlayer dielectric;
   forming a second interlayer dielectric over the second stopper layer;
   forming a third stopper layer over the second dielectric; and
   etching a via hole in the semiconductor device, with at least one etchant gas that has a proportion of oxygen to carbon monoxide of about 7:90, and ashing using not more than 8% oxygen.

2. The process of claim 1, wherein the first dielectric layer comprises FSG and the second dielectric layer comprises FSG.

3. The process of claim 1, wherein the first stopper layer comprises SiN.

4. The process of claim 1, wherein the second stopper layer comprises SiC.

5. The process of claim 1, wherein the third stopper layer comprises a layer of SiON over the second dielectric and a layer of SiC over the layer of SiON.

6. The process of claim 1, wherein the wiring layer comprises copper.

7. The process of claim 1, wherein the etching step comprises the following sequential steps:
   (1) etching using a gas mixture comprising $Ar:C_4F_8:C_2F_6:O_2$;
   (2) etching using a gas mixture comprising $Ar:O_2:C_4F_8:CO$;
   (3) etching using a gas mixture comprising $Ar:CHF_3:C_2F_6:N_2$;
   (4) etching using a gas mixture comprising $Ar:O_2:C_4F_8:CO$; and
   (5) etching using a gas mixture comprising $Ar:N_2:C_4F_8:CO$.

8. The process of claim 7, wherein the etching step comprises the following sequential steps:
   (1) etching using a gas mixture comprising $Ar:C_4F_8:C_2F_6:O_2$ in a proportion of about 11:1:2:2;
   (2) etching using a gas mixture comprising $Ar:O_2:C_4F_8:CO$ in a proportion of about 9:1:2:13;
   (3) etching using a gas mixture comprising $Ar:CHF3:C2F6:N2$ in a proportion of about 13:1:4:2;
   (4) etching using a gas mixture comprising $Ar:O_2:C_4F_8:CO$ in a proportion of about 15:1:3:23; and
   (5) etching using a gas mixture comprising $Ar:N_2:C_4F_8:CO$ in a proportion of about 8:1:2:13.

* * * * *